Sept. 20, 1960 JACQUES I. PANTCHECHNIKOFF NOW BY CHANGE OF NAME JACQUES ISAAC PANKOVE 2,953,730
HIGH FREQUENCY SEMICONDUCTOR DEVICES
Filed Nov. 7, 1952 2 Sheets-Sheet 1

INVENTOR.
JACQUES I. PANTCHECHNIKOFF

BY J. L. Whittaker
ATTORNEY

Sept. 20, 1960 JACQUES I. PANTCHECHNIKOFF NOW BY CHANGE OF NAME JACQUES ISAAC PANKOVE 2,953,730

HIGH FREQUENCY SEMICONDUCTOR DEVICES

Filed Nov. 7, 1952 2 Sheets-Sheet 2

INVENTOR.
JACQUES I. PANTCHECHNIKOFF

BY J. C. Whittaker
ATTORNEY

United States Patent Office 2,953,730

Patented Sept. 20, 1960

2,953,730

HIGH FREQUENCY SEMICONDUCTOR DEVICES

Jacques I. Pantchechnikoff, now by change of name Jacques Isaac Pankove, Dutch Neck, N.J., assignor to Radio Corporation of America, a corporation of Delaware Filed Nov. 7, 1952, Ser. No. 319,193

31 Claims. (Cl. 317—235)

This invention pertains to semiconductor devices and particularly to P-N junction type semiconductor devices, such as transistors, for use at high frequencies. The invention also provides improved apparatus useful in etching semiconductor bodies.

A typical P-N junction type semiconductor device, such as a transistor, comprises a body of semiconductor material having zones of alternating N-type conductivity and P-type conductivity. Any two adjacent zones are separated by a rectifying barrier which has high resistance to electrical current flow in one direction and low resistance in the other direction.

According to one method of manufacture, a junction type semiconductor device may be prepared from a single block of semiconductor material such as germanium, silicon or the like. A pair of P-N junctions are formed beneath opposite surfaces of the block by alloying quantities of a so-called impurity material with portions of the semiconductor material of the block. The junctions are generally formed coaxial with each other and the portions thereof within the semiconductor block are comparatively closely spaced. The impurity material is chosen so that, in a block of semiconductor material of one type of conductivity, the alloying operation produces a rectifying barrier and a layer or zone of material of the opposite type of conductivity. For example, if the block of semiconductor comprises N-type germanium, then any one of indium, gallium, aluminum, zinc or boron, for example, may be used as the impurity material to produce one or more zones of P-type conductivity and rectifying barriers between the N-type body and P-type zones. If the semiconductor body is of P-type material, then any one of phosphorus, arsenic, antimony or bismuth, for example, may be used to produce one or more zones of N-type conductivity each separated from the P-type zone by a rectifying barrier. After the impurity materials are alloyed into the semiconductor block to produce P-type or N-type regions, as the case may be, electrode leads are connected to these regions and are biased so that one region functions as a collector and the other functions as an emitter of electrical charges. Another electrode is connected to the main body of the block and functions as a base electrode.

In use of a transistor employing an N-type semiconductor block, the emitter region or electrode is biased positively with respect to the base electrode and injects positive charge carriers or "holes" into the semiconductor body in accordance with an input signal applied to the emitter. By "holes" is meant electron deficiencies in the crystal lattice of the semiconductor body. The collector region or electrode is biased negatively with respect to the base electrode and functions to attract the charges injected by the emitter and to emit electrons into the semiconductor body. In a transistor employing a P-type semiconductor body, the emitter is biased negatively with respect to the base electrode and emits electrons while the collector is biased positively with respect to the base electrode and collects electrons.

In a device of the type described, a circuit parameter denoted as base resistance plays an important part in high frequency operation of the device. The base resistance is a direct function of the resistivity of the body of the semiconductor block and of the length and cross-sectional area of the block present between the base electrode and the collector electrode and between the base electrode and the emitter electrode. Another circuit parameter is the capacitance present between zones of alternating conductivity, i.e., at the emitter and collector junction regions respectively within the body of the semiconductor block. The resistance and capacitance effectively constitute a delay line which extends from the base electrode along the lengths of the emitter and collector junction regions, thus determining the time constant of the device. Thus differences in signal transit time exist between the base electrode and the portions of the junctions near it as compared with those progressively more remote from it. These differences in transit time along the junctions produce a phase shift in the passage of electrical charges between the emitter and collector regions, the phase shift becoming increasingly important as the device is operated at higher and higher frequencies.

In the operation of a transistor, electrical charges flowing from the emitter region to the collector region progress through the body of the device substantially by a process of diffusion. Clearly, this mode of operation imposes a limit on the utility of the transistor at high frequencies.

The principal object of this invention is to provide a semiconductor device of improved structural form.

Another object is to provide an improved semiconductor device particularly suited for use at high frequencies and having reduced base resistance and reduced phase shift in electrical charge transmission.

Another object is to provide a jig useful in constructing semiconductor devices.

In general, the principles and objects of this invention are accomplished by reducing the effective length of the delay line and hence its time constant. This may be accomplished either by decreasing the base resistance or by decreasing the effective capacitance co-acting with the base resistance to form the delay line. For example, the desired result may be achieved by forming the base electrode as a ring surrounding or symmetrical with respect to the emitter and collector electrodes. Alternatively, either the emitter or collector electrode or both may be formed as a ring with the base electrode as a concentric ring or as a single central dot.

As a further feature of the invention, an auxiliary electric field is provided for accelerating the passage of electrical current from the collector electrode to the emitter electrode.

The invention is described in greater detail by reference to the drawings wherein.

Like elements are designated by the same reference numerals throughout the drawings.

The principles of the invention are described with reference to the preparation of a P-N-P transistor from a block of N-type germanium with indium as the impurity substance used in forming the P-N junctions. It is well known, however, that silicon may be used instead of germanium as the semiconductor material and that another metal such as aluminum, gallium, boron or zinc may be used as the impurity substance. An N-P-N device may be similarly prepared using P-type germanium (or silicon) with the appropriate impurity substance, for example, arsenic, bismuth, antimony or phosphorus. The principles of the invention are also applicable to semiconductor bodies having the desired P-N junctions formed during the growth of the crystal.

Figures 1, 2, 3, 4, 5, 6:
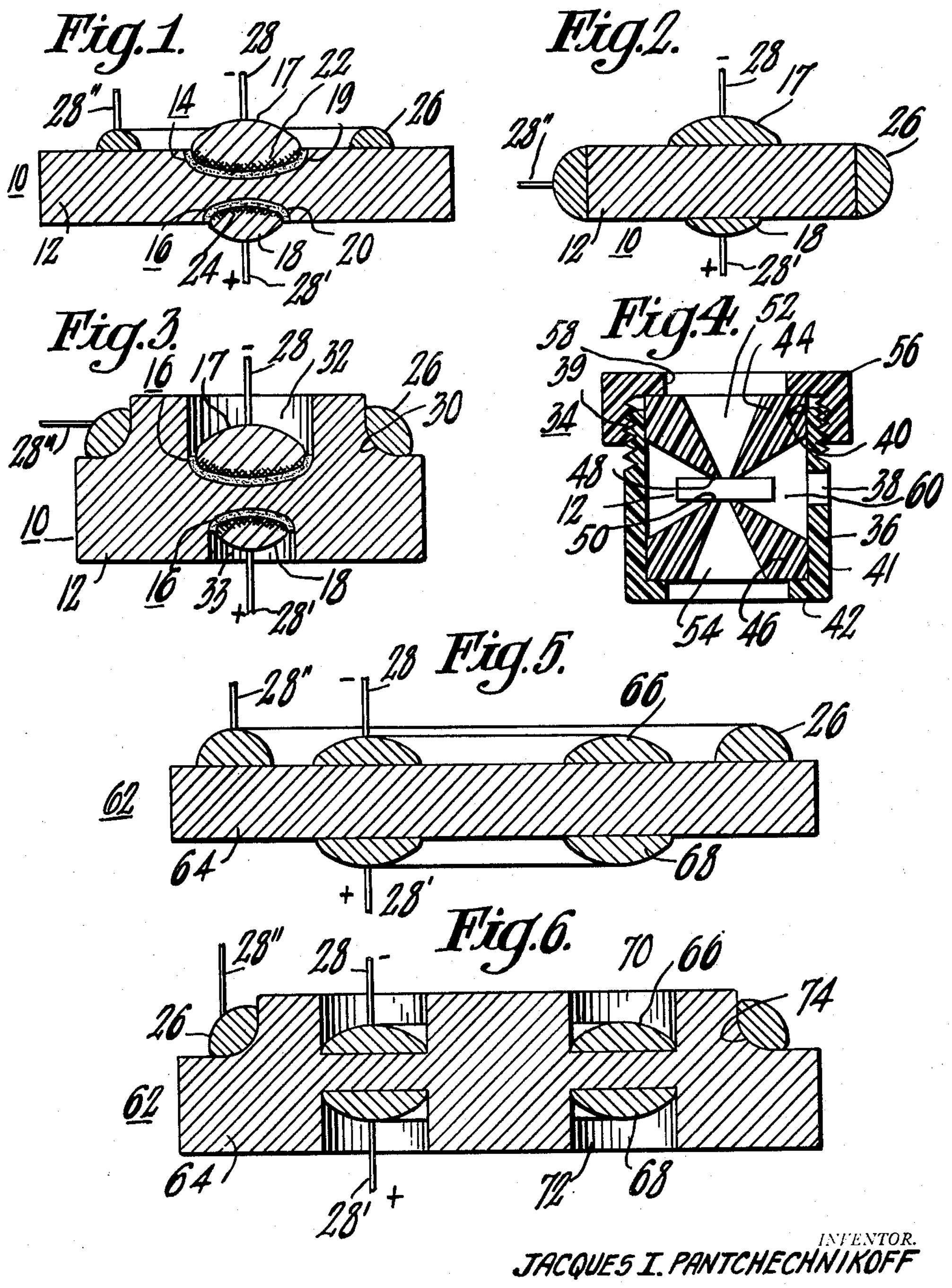
Fig. 1 is a sectional, elevational view of a transistor embodying the invention in one of its aspects.
Fig. 2 is a sectional, elevational view of a modified transistor also embodying the invention.
Fig. 3 is a sectional, elevational view of a transistor modified from the construction shown in Fig. 1.
Fig. 4 is a sectional, elevational view of apparatus useful in etching semiconductor bodies in pursuance of the invention in certain of its aspects.
Fig. 5 is an elevational view of still another modified transistor embodying the principles of the invention.
Fig. 6 is a sectional, elevational view of an alternative arrangement of the transistor shown in Fig. 5.

In Fig. 1, there is shown a semiconductor device 10, according to a first embodiment of the invention, which comprises a block or wafer 12 of N-type germanium having two P-N junctions 14 and 16 formed beneath opposite surfaces thereof. One satisfactory method for forming the junctions is described in a copending U.S. application of Charles W. Mueller, Serial No. 295,304, filed June 24, 1952, and assigned to the assignee of this application, and now abandoned. According to the method described in said application and to form a P-N-P transistor, disks or pellets of indium are placed in contact with opposite surfaces of the block 12 of N-type germanium. The assembly of block and pellets is heated in an atmosphere of hydrogen, or an inert gas such as argon, which has first been de-oxidized and dried in a liquid air trap. The heating is effected at a temperature sufficient to cause the pellets to melt and alloy with the germanium block to leave portions 17 and 18 of the pellets projecting above the surfaces of the block 12 and to form rectifying barriers 19 and 20 and P-type conductivity regions 22 and 24 beneath the surfaces.

Next, according to the invention, a base electrode 26 is bonded to the germanium block. The base electrode may be of tin or some similar material having a low melting point and capable of forming an ohmic, or non-rectifying contact with the germanium. The base electrode 26 is formed in the shape of an annulus and is positioned on the germanium block substantially coaxially with one of the P-N junctions, e.g. junction 14, and as close to the selected junction as possible while contacting only the N-type conductivity zone. Either of the P-N junctions 14 or 16 may be operated as the emitter or collector electrode in the completed transistor. Furthermore, the base ring 26 may surround either the emitter or collector, preferably the collector. Since, in operation of such a P-N-P transistor, the base electrode is biased negative with respect to the emitter, if the base surrounds the emitter, an undesirable amount of current flows to the base. If the base surrounds the collector electrode, and particularly, if the collector electrode is larger than the emitter electrode, a considerably smaller amount of current, if any, flows to the base electrode. Throughout this application, the terms emitter and collector electrode include the rectifying barrier, layer of P-type material and all of the alloyed indium pellet beneath and above the surface of the germanium block. The base electrode is bonded to the germanium block 12 by being heated and melted sufficiently to form a bond with the block. Leads 28, 28' and 28'' are connected, in low resistance contact, respectively to the portions 17 and 18 of the original impurity pellets remaining projecting above the surfaces of the germanium block and to the base ring 26. The leads 28, 28' and 28'' may be made of nickel or fine gauge tungsten wire plated with copper and may be attached by means of a low melting point solder. Coil dope may be applied to the surfaces of the device for protection against the atmosphere and the entire unit may then be mounted on a glass stem and potted in a synthetic resin with or without an added opacifier.

If desired, as shown in Fig. 2, the germanium body 12 may be formed as a disk and the annular base electrode 26 may be bonded to the circumferential periphery of the block. This arrangement of the base electrode may also be employed in the embodiments of the invention described below by reference to Figs. 3, 5, 6, and 7.

In operation of the device 10, the junction region selected to be operated as the emitter electrode, for example junction 16, is biased positively with respect to the base electrode 26 and the other junction 14 is biased negatively with respect to the base electrode and is operated as the collector electrode. This arrangement of parts, whereby the base electrode 26 is positioned close to and surrounding the emitter or collector junction, provides a considerably lower base resistance than constructions previously employed in junction type transistors. This reduction in base resistance results from the shorter paths through the germanium block from the base electrode to the other electrodes. In addition, the effective distance between the base and remote portions of the electrode, either the emitter or collector, surrounded by the base is reduced by approximately one-half due to the base electrodes being a ring surrounding and preferably coaxial with such other electrode. By this means, and due to the symmetrical arrangement of the electrodes, the base-to-emitter or collector signal transit paths are also more uniform.

A problem arises when it is desired to bond an annular-shaped metallic member, e.g., the base electrode 26, to one surface of a germanium crystal. During heating of the ring electrode and before effective wetting and bonding of the electrode take place, surface tension tends to make the ring shrink toward its center and form a homogeneous ball.

One solution of this problem is to provide a spacer for maintaining the shape of the ring electrode until wetting and bonding take place. Another, and preferred solution, according to the invention and shown in Fig. 3, is to provide an annular groove or recess 30 in the surface of the germanium block intended to receive the base electrode. Positioned in such a recess, the ring electrode is held in place and cannot contract into a ball and it can be heated until uniform wetting and bonding occur. In the device shown in Fig. 3 the emitter and collector electrodes are also formed in recesses 32 and 33 of generally circular cross section. Such construction provides the added advantage that the junctions can be formed with a desirably small spacing between them, which may be of the order of one-half to one mil, and charge collection and gain are thereby improved. Also, the required degree of spacing between the base 26 and collector 14, in order that the base shall engage only material of one type of conductivity, is better defined.

In the arrangement of Fig. 2, the emitter or collector or either of them may be recessed into the germanium block as shown in Fig. 3. These constructions impart increased ruggedness to crystals having a thin portion for close spacing of emitter and collector electrodes. In transistors wherein the emitter and collector electrodes are formed in recesses, it is preferable that the electrode be approximately as large in area as the recess. Such an arrangement minimizes surface recombination of holes and electrons.

The recesses 30, 32, 33 in the germanium block 12 may be formed in a number of ways. For example, they may be formed by means of a stream of fine abrasive which is directed against the germanium block which has its surfaces masked to expose only the areas to be abraded. The masking material may consist of substances such as nickel, copper or stainless steel. After this abrading operation, the block is etched in a conventional etching solution, for example, a mixture of hydrofluoric acid, nitric acid and copper nitrate. Alternatively, the recesses may be formed entirely by etching with a solution and with the block 12 suitably masked. In this instance, the masking material may consist of a substance which is not attacked by the etching solution, such as a lacquer, a wax or a paint. If an etching operation is employed, the crystal 12 is prepared for etching by being degreased in acetone, washed in water and dried.

The recesses 30, 32, and 33 are preferably formed in the semiconductor block 12 by an etching operation and with the aid of a masking jig 34 shown in Fig. 4. The jig comprises a hollow cylinder 36 of an acid resistant plastic material, such as polystyrene, having an opening 38 in the peripheral wall thereof. One end 39 of the cylinder has an unimpeded opening 40 and the other end 41 has an opening defined by an annular lip 42 projecting inwardly. A pair of hollow, frusto-conical clamping and masking members 44 and 46 are slidably positioned concentrically within the cylinder 36 with their apices 48, 50 juxtaposed and their bases 52 and 54 adjacent to the respective open ends of the cylinder. The conical members are made of a resilient chemically inert material such as that material made by polymerizing gaseous tetrafluoroethylene. The members 44 and 46 have a snug fit with the inner wall of the cylinder and function to clamp the crystal 12 firmly in position and to mask the portions of the crystal to be protected from the etching solution. The members 44 and 46 need not be cones and may take different forms which will provide the desired function.

A cap 56 of an acid resistant plastic material such as polystyrene having an aperture 58 is provided for attachment to the end 39 of the cylinder 36 as by threaded portions provided for that purpose. The aperture in the cap has a somewhat larger diameter than the opening in the base of the frusto-conical member 44 adjacent thereto. However, the size of this opening is not critical. Thus the masking device is constructed so that access may be had into the interior thereof through the aperture 58 in the cap 56 and the hollow member 44, through the open end 41 of cylinder and the hollow member 46, and through the lateral aperture 38 in the wall of the cylinder 36 into a peripheral chamber 60 formed between the outer walls of the conical members and the inner wall of the cylinder.

In using the device 34 one conical member, e.g. member 46, is positioned within the cylinder 36 with its base 54 flush against the lip 42. The germanium crystal 12 to be etched is positioned between the apex 50 of the member 46 and the apex 48 of the member 44 which is brought into contact with the free surface of the crystal. The apices of the clamping members bearing against opposite surfaces of the crystal 12 mask the portions of the crystal to be protected from the etching solution. The spatial relationships thus established are maintained by fastening the cap 56 on the threaded end 39 of the cylinder 36. The cap bearing against the member 44 applies the pressure necessary to maintain the crystal firmly between both clamping members. The crystal 12 is now ready to be etched. The mounting and etching operations are facilitated by the translucency of the materials composing the jig and because the crystal to be etched can readily be manipulated by tweezers inserted through the opening 38.

Figures 7, 8, 9, 10, 11, 12, 13:
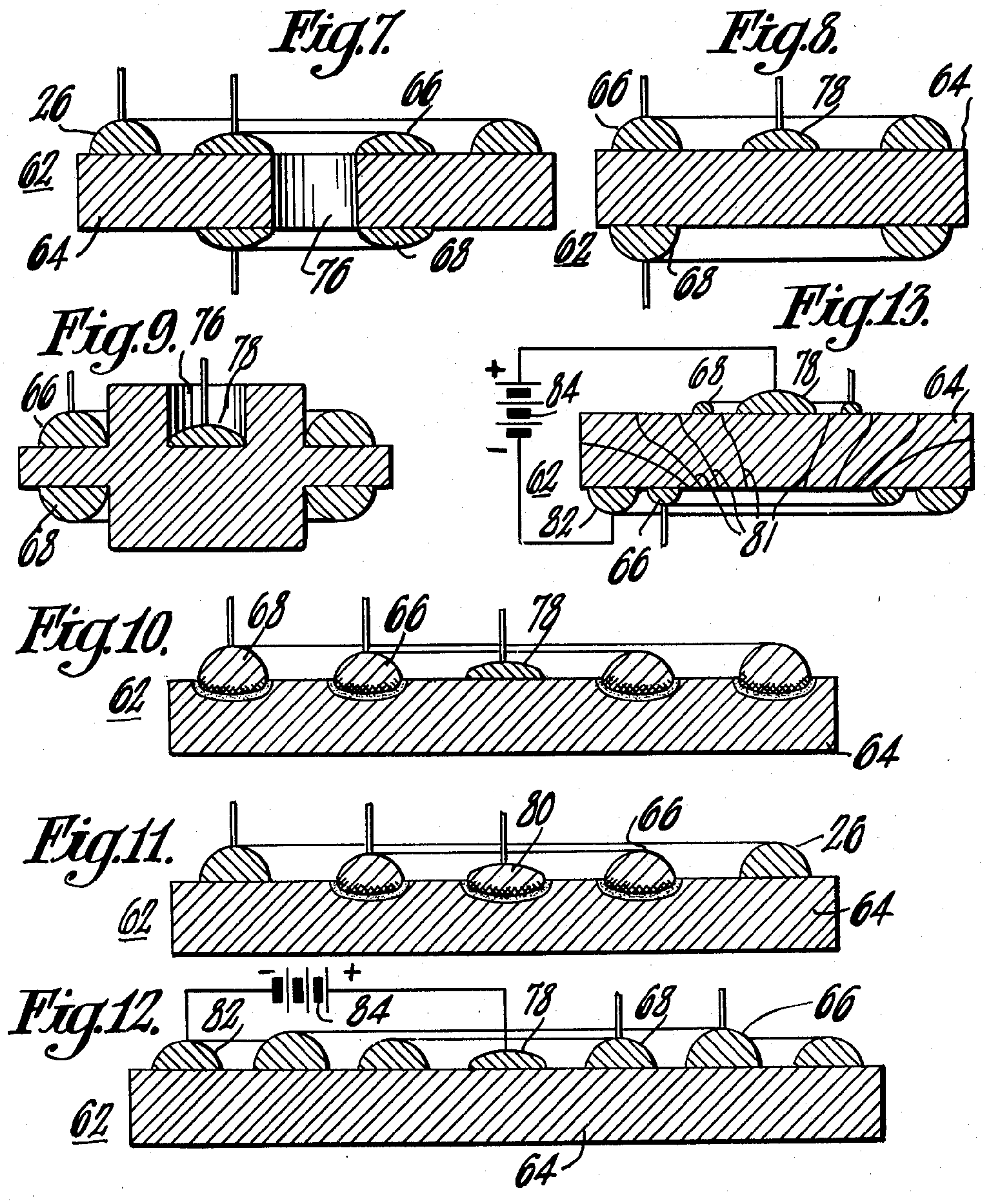
Fig. 7 is a sectional elevational view of an alternative arrangement of the device shown in Fig. 5.
Fig. 8 is an elevational view of another embodiment of the invention.
Fig. 9 is a sectional elevational view of an alternative arrangement of the device shown in Fig. 8.
Fig. 10 is an elevational view of a further embodiment of the invention.
Fig. 11 is an elevational view of still another embodiment of the invention.
Fig. 12 is an elevational view of another embodiment of the invention.
Fig. 13 is an elevational view of still another embodiment of the invention.

To etch the crystal 12, a quantity of etching agent, for example the mixture set forth above, is introduced through one of the hollow conical clamping members, e.g. member 44, and onto one of the surfaces of the germanium block where it forms an etching pool. The etchant is allowed to etch the crystal for the desired length of time and then it is removed. The depth of etching may be measured by a probe inserted into the recess. After the desired etch has been achieved, the crystal is washed in water to halt the etching action. If it is desired to etch the opposite surface of the germanium crystal, another quantity of the etching solution is introduced through the hollow conical support member 46 to form a pool on the unetched surface of the germanium crystal. Finally, in order to make the desired annular groove to accommodate the base electrode, etching solution is introduced through the lateral opening 38 in the cylinder 36 and into the peripheral chamber 60 formed between the two conical clamping members. Thus the acid gains access to the entire periphery of the germanium crystal 12. With the arrangement shown and described, the etchant in the chamber 60 first erodes most markedly the portions of the periphery near the upper and lower surfaces of the block 12. If this activity is allowed to progress, annular grooves or shoulders are etched in both surfaces of the crystal as best shown in Fig. 9, hereinafter to be described, with a relatively thin flange of germanium separating the grooves. If the etching action is allowed to continue, the thin flange is eroded and the periphery of the crystal becomes once more a smooth surface. This operation may be used to form a germanium crystal into a disc having a desired diameter. Alternatively, the crystal block may be formed with only one annular recess 30 as in Fig. 3 by suitably masking, with lacquer or the like, the surface of the block which is not to be provided with an annular recess or shoulder. After the desired etching operations have been completed, the crystal is removed from the jig 34. The crystal is washed in water and dried and is then ready for further operations. In one device actually constructed, the diameter of the etched rescesses 32 and 33 was approximately 80 mils. The thickness of the germanium block was 15 to 20 mils and the recesses were etched to such a depth that the germanium membrane separating the recesses was one to three mils thick. These dimensions are not critical and may be varied as required.

A further embodiment of the invention in which phase shift is reduced includes emitter and collector electrodes which are formed as rings. This construction reduces the radial extent of both of these electrodes and thus reduces the radial distribution of capacitance and the length of the aforementioned delay line. Such an arrangement is shown in Fig. 5 wherein a semiconductor device 62 comprises a body of semiconductor material 64, for example N-type germanium, having collector and emitter electrodes 66 and 68 formed by the alloying of indium rings into opposite surfaces of the body according to the above-mentioned Mueller method. Leads 28 and 28' are bonded to the collector and emitter respectively. In this embodiment, too, the base electrode 26 is formed as a ring around either the emitter or collector electrode and is provided with a lead 28''.

If desired, the device shown in Fig. 5 may be constructed as shown in Fig. 6, wherein, to achieve more convenient assembly of the device, the semiconductor body is provided with annular recesses 70, 72, 74 for each of the collector, emitter, and base electrodes respectively. A further advantage of this construction arises from the fact that the emitter and collector electrodes are separated by a thin layer of germanium. This arrangement further enables the electrical charge transit paths to be shortened and rendered more uniform.

A further embodiment of the invention is shown in Fig. 7. This embodiment may be a duplicate of the embodiment illustrated in Fig. 5 except that the center of the germanium body 64, within the collector and emitter electrodes 66 and 68 is removed and a hole 76 remains. This may be accomplished by abrasive-blasting followed by etching or by selectively masking the device and etching. The device 34, Fig. 4, may also be so employed. This construction has the advantage that a plurality of the devices shown may be mounted in a stack on a suitable support rod inserted in the central opening 76. Alternatively, a cylinder or tube carrying a cooling fluid may be inserted into the central opening. A device having a central opening as in Fig. 7 may employ a germanium block provided with recesses or grooves to accommodate the emitter, collector and base electrodes.

A further embodiment of the invention by which base resistance and phase shift are reduced is shown in Fig. 8. In this embodiment, the collector and emitter electrodes, or P-N junctions, 66 and 68 are formed from indium rings positioned, preferably axially aligned on opposite surfaces of the germanium wafer 64. In this instance, the base electrode connection comprises a single pellet or dot 78 of a metal such as tin positioned on the surface of the block approximately in the center of the collector ring although satisfactory results can be obtained with the base electrode in the center of the emitter ring. This device too may be formed in a germanium block provided with recesses as shown in Fig. 9.

A modification of the device shown in Fig. 8 is illustrated in Fig. 10. In this modification, the collector and emitter rings 66 and 68 are alloyed from concentric positions on the same surface of the germanium block. In a preferred arrangement, the collector ring 66 is positioned between the emitter 68 and the base 78. By this means efficient charge collection occurs since the field appearing between the emitter and base due to the D.C. bias applied in the base-to-emitter circuit tends to draw electrical charges from the emitter toward the collector. Another arrangement similarly to utilize an electric field for aiding charge collection is shown in Fig. 11. In this embodiment the collector electrode 66 and base electrode 26 are coaxial rings with the base surrounding the collector. The emitter, however, is a single dot 80 positioned within the collector ring 66. Here, too, the field applied between the emitter 80 and the base 26 promotes the passages of charges from the emitter to the collector.

A further modification of the invention wherein an applied electric field is utilized to promote charge collection is illustrated in Fig. 12 as applied to the embodiment of the invention shown in Fig. 10. The device shown includes the annular collector and emitter electrodes 66 and 68. The base electrode for the device comprises the central dot base electrode 78 and an additional metal ring 82, of tin or the like, both of which are bonded to the surface of the semiconductor body to form ohmic, or non-rectifying, contacts. The auxiliary ring 82 is coaxial with and surrounding the emitter and collector electrodes. If desired, when the semiconductor body is in the form of a disk, the auxiliary-ring 82 may be bonded to the circumferential periphery thereof as shown in Fig. 2. The dot 78 and the ring 82 are connected to the positive and negative poles respectively of a bias source 84 which thus provides a substantially uniform field in the semiconductor body between the emitter and collector ring electrodes. By the application of such an electric field, the passage of electrical charges from the emitter electrode to the collector electrode is accelerated and the high frequency response of the device is improved by the subsequent reduction in transit time.

An auxiliary electric field may be provided, similarly, in other embodiments of the invention, for example that shown in Fig. 8. In this instance, referring to Fig. 13, the auxiliary tin ring 82 is bonded to the same surface of the semiconductor body 64 as the collector electrode 66 and surrounds the latter electrode. The base dot 78 is located within the emitter ring 68. The voltage source 84 is connected between the dot 78 and the ring 82 as shown in Fig. 12. The distribution of the electric field between the dot 78 and the ring 82 illustrated by the equipotential lines 81 is such that charges emanating from the emitter 68 are drawn radially outwardly away from the emitter and improved charge collection results if the collector electrode is formed with a larger diameter than the emitter electrode.

The material forming the collector and emitter electrodes in Figs. 2, 5 to 9 inclusive, 12 and 13 will alloy with the germanium crystal as roughly indicated in Figs. 1 and 3. Such showing is omitted from Figs. 2, 5 to 9 inclusive, 12 and 13 merely for convenience in illustration.

What is claimed is:

1. A semiconductor device comprising a body of semiconductor material of one conductivity type, a plurality of annular zones of different conductivity type present in said body, and an annular electrode bonded to said body.

2. A semiconductor device comprising a body of semiconductor material of one conductive type, a plurality of annular zones of different conductivity type present in said body, and an annular electrode bonded to said body in ohmic contact.

3. A semiconductor device comprising a body of semiconductor material of one conductive type, a plurality of annular zones of different conductivity type present in said body, and a two-part ohmic contact electrode bonded to said body, said two parts being spaced apart on said body and adapted to co-act to apply an electric field between said annular zones.

4. A semiconductor device comprising a body of semiconductor material of one type of conductivity, a plurality of annular zones of different conductivity type present in said body, an annular electrode mounted in ohmic contact with said body, said zones and said electrode being axially aligned.

5. A semiconductor device comprising a body of semiconductor material, a P-N junction present beneath each of two opposite surfaces of said body, said P-N junctions being ring-shaped and axially aligned and an annular base electrode bonded to one surface of said body and surrounding one of said junctions.

6. A device in accordance with claim 5 having an opening extending through the semiconductor body within the ring-shaped P-N junctions.

7. A semiconductor device comprising a body of semiconductor material having a plurality of recesses formed therein, an electrode positioned within each of said recesses, an annular recess present in one surface of said body and an annular electrode connected to said body within said recess.

8. A semiconductor device comprising a body of semiconductor material having a plurality of recesses formed therein, a P-N junction formed beneath each of said recesses, an annular recess present in one surface of said body, and an annular ohmic base electrode connected to said body within said recess.

9. A semiconductor device comprising a body of semiconductor material, an annular recess in one surface of said body, another annular recess in the opposite surface of said body, a P-N junction formed within said body beneath each of said recesses, said junctions being of unequal areas, an annular groove in one of said surfaces of said body around one of said recesses, and a metal electrode mounted in said groove.

10. A semiconductor device comprising a body of semiconductor material, a ring-shaped base electrode mounted on one surface of said body, a ring-shaped collector electrode mounted on said surface concentric with and within said base electrode and an emitter electrode mounted on said surface concentric with said base and collector electrode.

11. A semiconductor device comprising a body of semiconductor material, a pair of annular shaped recesses formed in opposite surfaces of said body, a ring-shaped collector electrode positioned in one of said recesses, a ring-shaped emitter electrode positioned in the other of said recesses, another recess present in said body concentric with said ring-shaped recesses and a base electrode mounted in said other recess.

12. A semiconductor device comprising a body of semiconductor material, a ring-shaped emitter electrode present in one surface of said body, a ring-shaped collector electrode present in the opposite surface of said body and a base electrode positioned on one surface of said body in axial alignment with the ring-shaped electrode present in said surface.

13. A semiconductor device comprising a body of semiconductor material having a central opening, a ring-shaped emitter electrode present in one surface of said body axially aligned with said opening, a ring-shaped collector electrode present in an opposite surface of said body, a ring-shaped base electrode mounted on one surface of said body axially aligned with and surrounding said collector electrode.

14. A semiconductor device comprising a body of semiconducting material, a pair of annular recesses formed in opposite surfaces of said body, an emitter electrode present in said one of recesses, a collector electrode present in the other said recesses, a ring-shaped recess formed in said body concentric with and surrounding one of said other recesses and a ring-shaped base electrode mounted in said last named recess.

15. A semiconductor device comprising a body of semiconductor material, an emitter electrode present in one surface of said body, a collector electrode present in the opposite surface of said body, said electrodes being ring-shaped and concentric with each other and a ring-shaped base electrode surrounding said emitter and collector electrodes.

16. A semiconductor device comprising a body of semiconductor material, an emitter and a collector electrode positioned in said body, said electrodes being annular in form and coaxially aligned, and a base electrode mounted on said body, said base electrode comprising a metal dot and an auxiliary metal ring adapted to co-act to apply an electric field between said emitter and collector electrodes to facilitate the passage of current therebetween.

17. A semiconductor device comprising a body of semiconductor material, a plurality of annular electrodes axially aligned and in rectifying contact with said body and another annular electrode in ohmic contact with said body.

18. A semiconductor device comprising a body of semiconductor material, a plurality of annular electrodes axially aligned and in rectifying contact with said body and another annular electrode in ohmic contact with said body and axially aligned with said plurality of annular electrodes.

19. The device defined in claim 18 and including an annular depression present in said body within which one of said annular electrodes is positioned.

20. A semiconductor device comprising a semiconductor body having at least two substantially parallel surfaces and an annular electrode in rectifying contact with each of said surfaces.

21. A semiconductor device comprising a semiconductor body having at least two substantially parallel surfaces and an annular electrode in rectifying contact with each of said surfaces and another electrode in ohmic contact with said body.

22. A semiconductor device comprising a semiconductor body having at least two substantially parallel surfaces and an annular electrode in rectifying contact with each of said surfaces and another annular electrode in ohmic contact with said body.

23. A semiconductor device comprising a semiconductor body having at least two substantially parallel surfaces and an annular electrode in rectifying contact with each of said surfaces and another annular electrode in ohmic contact with said body, all of said electrodes being axially aligned.

24. A semiconductor device comprising a body of semiconductor material, a plurality of annular electrodes axially aligned and in rectifying contact with said body and means comprising two additional electrodes in contact with said body for applying an electric field in said body, said electric field being oriented to promote the flow of current between said annular electrodes.

25. A semiconductor device comprising a body of semiconductor material, a plurality of annular electrodes axially aligned and in rectifying contact with said body, a current flow path being defined in said body between said electrodes and means in contact with said body for applying an electric field in said body, said electric field being oriented to promote the flow of current between said annular electrodes, said means comprising a pair of electrodes in ohmic contact with said body and axially aligned with said current path.

26. A P-N junction device comprising a semiconductor body of one conductivity type having a bore therein containing an activator element of the opposite conductivity type fused therein to form a rectifying junction with said semiconductor body.

27. A P-N junction device comprising a semiconductor body of one conductivity type having a bore therein and a zone of opposite conductivity type in said body surrounding said bore and co-axial with said bore.

28. A P-N junction device comprising a semiconductor body having a bore therein, an electrode connected to said body within said bore, and a P-N junction in said body co-axial with said bore.

29. A P-N junction device comprising a semiconductor body of one conductivity type having a recess therein containing an activator element of the opposite conductivity type fused therein to form a rectifying junction with said semiconductor body.

30. A semiconductor device comprising a body of semiconductor material, a ring-shaped rectifying electrode on a surface of said body, an ohmic electrode on said surface within said ring-shaped electrode, another ohmic electrode bonded in annular contact to said body outside of and axially aligned with said ring-shaped rectifying electrode, and a second rectifying electrode on said body.

31. A transistor comprising a semiconductor body of one conductivity type having recesses in opposed surfaces thereof, said recesses containing impurities of opposite conductivity inducing type in rectifying contact with said semiconductor body.

References Cited in the file of this patent

UNITED STATES PATENTS

| | | |
|---|---|---|
| 2,524,033 | Bardeen | Oct. 3, 1950 |
| 2,524,034 | Brattain et al. | Oct. 3, 1950 |
| 2,524,035 | Bardeen et al. | Oct. 3, 1950 |
| 2,543,778 | Henroteau | Mar. 6, 1951 |
| 2,560,579 | Kock et al. | July 17, 1951 |
| 2,563,503 | Wallace | Aug. 7, 1951 |
| 2,569,347 | Shockley | Sept. 25, 1951 |
| 2,592,693 | Hayms | Apr. 15, 152 |
| 2,597,028 | Pfann | May 20, 1952 |
| 2,623,102 | Shockley | Dec. 23, 1952 |
| 2,623,105 | Shockley et al. | Dec. 23, 1952 |
| 2,644,852 | Dunlap | July 7, 1953 |
| 2,644,914 | Kircher | July 7, 1953 |
| 2,757,323 | Jordan et al. | July 31, 1956 |
| 2,764,642 | Shockley | Sept. 25, 1956 |
| 2,771,382 | Fuller | Nov. 20, 1956 |
| 2,781,481 | Armstrong | Feb. 12, 1957 |
| 2,792,538 | Pfann | May 14, 1957 |